(12) United States Patent
Mauri et al.

(10) Patent No.: US 7,791,845 B2
(45) Date of Patent: Sep. 7, 2010

(54) TUNNELING MAGNETORESISTIVE SENSOR HAVING A HIGH IRON CONCENTRATION FREE LAYER AND AN OXIDES OF MAGNESIUM BARRIER LAYER

(75) Inventors: Daniele Mauri, San Jose, CA (US); Alexander M. Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 779 days.

(21) Appl. No.: 11/645,462

(22) Filed: Dec. 26, 2006

(65) Prior Publication Data

US 2008/0151442 A1 Jun. 26, 2008

(51) Int. Cl.
*G11B 5/39* (2006.01)
*G11C 11/00* (2006.01)

(52) U.S. Cl. .................. 360/324.2; 257/421; 365/158; 428/811.1

(58) Field of Classification Search ............... 360/324.2; 428/812, 811.1; 257/421–427; 365/145, 365/158, 171–173
See application file for complete search history.

(56) References Cited

U.S. PATENT DOCUMENTS

| 6,784,509 | B2* | 8/2004 | Yuasa et al. .................. 257/421 |
| 7,223,485 | B2* | 5/2007 | Yuasa et al. .................. 428/812 |
| 7,248,497 | B2* | 7/2007 | Saito et al. .................... 365/158 |
| 7,333,306 | B2* | 2/2008 | Zhao et al. ............. 360/324.12 |
| 2004/0246632 | A1 | 12/2004 | Nishioka et al. |
| 2005/0110004 | A1 | 5/2005 | Parkin et al. |
| 2005/0168888 | A1 | 8/2005 | Miyauchi et al. |
| 2005/0185454 | A1 | 8/2005 | Brown et al. |
| 2006/0188750 | A1* | 8/2006 | Ide et al. ..................... 428/812 |

FOREIGN PATENT DOCUMENTS

JP  2003304010  10/2003

* cited by examiner

*Primary Examiner*—A. J. Heinz
(74) *Attorney, Agent, or Firm*—D'Arcy H. Lorimer; Lorimer Labs

(57) ABSTRACT

An improved formulation for free layers in MTJ sensors is disclosed. Optimized results of the prior art suggest free layer iron concentrations less than 20 atomic % give the best performance. The present invention discloses improved TMR ratio, $H_{ce}$, and λ performance for high free layer iron concentrations between about 70 and 91.5 atomic %, when compared to the prior art.

18 Claims, 5 Drawing Sheets

TUNNELING MAGNETORESISTIVE SENSOR HAVING A HIGH IRON CONCENTRATION FREE LAYER AND AN OXIDES OF MAGNESIUM BARRIER LAYER

BACKGROUND OF THE INVENTION

1. Field of the Invention

This invention relates to the composition and structure of thin film multi-layer magnetoresistive sensors. More specifically, the invention relates to the application and composition of free layers having iron contents greater than 50 atomic %, to magnetic tunnel junction (MTJ) sensors.

2. Description of the Related Art

MTJ sensors typically employ a multi-layered structure which includes a tunnel barrier layer positioned between two groups of ferromagnetic layers. The entire multi-layer structure is often referred to as a "stack". The tunnel barrier is a very thin dielectric layer, while the two groups of ferromagnetic layers are typically formed of a plurality of electrically conductive ferromagnetic materials and layers. On one side of the tunnel barrier, the magnetization direction of the ferromagnetic layers is "pinned" and provides a reference direction for the MTJ head. However, the magnetization direction of the ferromagnetic layers (the "free layers") formed on the other side of the tunnel barrier rotates freely in response to an external magnetic field from the magnetic medium proximate to the ABS. As the magnetization of the freely rotating ferromagnetic layer rotates in response to the external magnetic field from the magnetic medium, the resistance of the tunnel barrier changes, which can be measured as a change in resistance of the MTJ sensor.

The elemental composition of the free layers in the MTJ sensor have a major impact on the magnetic properties of the sensor, and therefore impact the overall performance. For good MTJ sensor performance, the free layer should have low coercivity ($H_{ce}$), low magnetostriction, Lambda ($\lambda$), high tunneling magneto-resistance (TMR) ratio, and low resistance times area product (RA). An optimum balance of these parameters has been reported in the prior art, disclosing amorphous Fe—Co—B alloy free layers having Fe concentrations less than 15-20 atomic %, and Fe:Co ratios of 1:9. Although free layer Fe concentrations as high as about 50 atomic % have been reported in the prior art, the performance of these layers is not balanced, in that they trade good performance in a single parameter (such as TMR ratio) at the expense of other parameters.

A summary of relevant prior art is provided below.

United States Patent Application Publication 2004/0246632 discloses a magnetoresistive head in which a pinned layer comprises two films, i.e., a ferromagnetic film A and a ferromagnetic B anti-ferromagnetically coupled to each other and a anti-ferromagnetic coupling film for separating the two ferromagnetic films A and B, where the coercivity of the ferromagnetic film alone is 200 (Oe) or more and the coercivity of the ferromagnetic film alone is 20 (Oe) or less. The compositions for the ferromagnetic film A and the ferromagnetic film B, when expressed by $Co_{(100-Y)}Fe_Y$ (at %) are: ferromagnetic film A: 80>Y>40, and ferromagnetic film B: 20>Y>0, where the material for the film in contact with the ferromagnetic film A is Ru, Ta, Ni—Fe—Cr alloy, Cu or Ni—Fe alloy.

United States Patent Application Publication 2005/0110004 discloses a magnetic tunnel element that can be used, for example, as part of a read head or a magnetic memory cell, including a first layer formed from an amorphous material, an amorphous tunnel barrier layer, and an interface layer between the first layer and the tunnel barrier layer. The interface layer is formed from a material that is crystalline when the material is in isolation from both the first layer and the tunnel barrier layer. Alternatively, the thickness of the interface layer is selected so that the interface layer is not crystalline. The first layer is formed from at least one material selected from the group consisting of amorphous ferromagnetic material, amorphous ferrimagnetic materials, and amorphous non-magnetic materials. The interface layer is formed from a material selected from the group consisting of a ferromagnetic material and a ferrimagnetic material.

United States Patent Application Publication 2005/0168888 discloses a magnetoresistive sensor comprising a pinned layer having a magnetization direction fixed with respect to an external magnetic field, a free layer, having a magnetization direction variable in accordance with the external magnetic field, and a spacer layer mainly containing copper, sandwiched between the pinned layer and the free layer. A sense current flows through the pinned layer, the spacer layer, and the free layer substantially in a direction in which the layers are stacked. The free layer comprises at least one intermediate stack composed of a non-magnetic layer mainly containing copper, and a first cobalt iron layer made of a cobalt iron alloy and disposed on boundaries on both sides of the non-magnetic layer, nickel iron alloy layers disposed on boundaries on both sides of the intermediate stack, and a second cobalt iron layer made of a cobalt iron alloy and formed in contact with the spacer layer on a boundary, opposing the spacer layer, of a stack composed of the intermediate stack and the nickel iron alloy layer.

United States Patent Application Publication 2005/0185454 discloses methods of manufacturing MTJ memory cells and structures thereof. A diffusion barrier is disposed between an anti-ferromagnetic layer and a pinned layer of an MTJ memory cell to improve thermal stability of the MTJ memory cell. The diffusion barrier may comprise an amorphous material or a Ni—Fe alloy. An amorphous material may be disposed adjacent a bottom surface of a tunnel junction, within a free layer, or both. An MTJ memory cell with improved thermal stability and decreased Neel coupling is achieved.

SUMMARY OF THE INVENTION

It is an object of the present invention to provide a magnetic sensor including a pinned layer; a free layer, consisting essentially of an alloy of cobalt, iron, and boron, wherein the iron concentration in the alloy is greater than 70 atomic %; and, a barrier layer residing between the pinned layer and the free layer.

It is another object of the present invention to provide a magnetic sensor including a pinning layer, a first pinned layer, a second pinned layer, and a spacer layer between the first and second pinned layers. The sensor also includes a free layer, consisting essentially of an alloy of cobalt, iron, and boron, wherein the iron concentration in the alloy is greater than 70 atomic %; and, a barrier layer residing between the second pinned layer and the free layer.

BRIEF DESCRIPTION OF THE DRAWINGS

The present invention will be better understood when consideration is given to the following detailed description thereof. Such description makes reference to the annexed drawings, wherein.

DETAILED DESCRIPTION OF THE PREFERRED EMBODIMENTS

Figure 1:
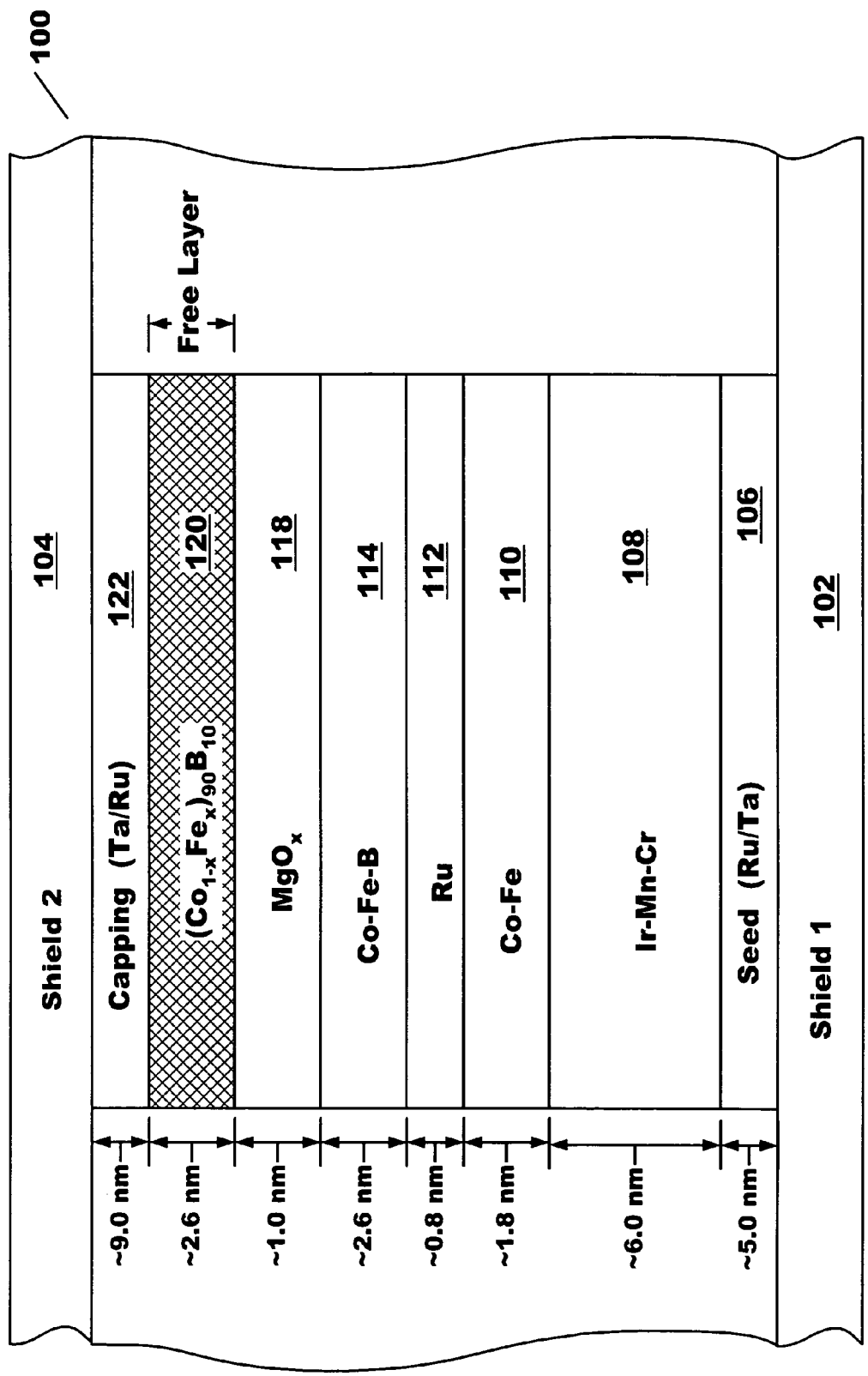
FIG. 1 is a partial cross sectional view of an MTJ sensor having a high iron content free layer, in accordance with an embodiment of the present invention.

FIG. 1 is a partial cross sectional view 100 of an MTJ sensor having a high iron content free layer, in accordance with an embodiment of the present invention. The figure discloses the layer stack (layers 106-122) disposed between shield layers 102 and 104. The stack comprises free layer 120, tunnel barrier layer 118, ferromagnetic pinned (keeper) layer 110, non-magnetic spacer layer 112, and ferromagnetic amorphous pinned (reference) layer 114, and anti-ferromagnetic pinning layer 108. Seed layer 106 and capping layer 122 are also included in the structure. Seed layer 106 typically is composed of a dual layer structure of a first layer of Ta having a thickness of about 3.0 nm, and a second layer of Ru having a thickness of about 2 nm. Anti-ferromagnetic pinning layer 108 is deposited over the Ru layer in seed layer 106, and is composed of an alloy of Ir—Mn—Cr, having a thickness of about 6.0 nm. Ferromagnetic pinned (keeper) layer 110 is composed of an alloy of Co—Fe, having a thickness of about 1.8 nm. Spacer layer 112 is composed of Ru, having a thickness of about 0.8 nm. Ferromagnetic amorphous pinned (reference) layer 114 is composed of an alloy of Co—Fe—B having a thickness of about 2.6 mm. Tunnel barrier layer 118 is composed of reactively sputtered $MgO_x$, having a thickness of about 1.0 nm. The forgoing materials and film thickness ranges indicated for layers 106-118, and 122 in FIG. 1, are meant to represent an exemplary selection only, as other combinations of materials, well known to those of ordinary skill in the art, are also suitable for use with free layer compositions of the present invention. Free layer 120 is composed of an Fe—Co—B alloy, having a boron composition of about 8.5 to 11 atomic %, and an Fe composition between 70 and 91.5 atomic % (remainder Co). The Fe concentration is preferably between 76 and 83 atomic %. The thickness of free layer 120 is typically about 2.6 nm.

The performance of the free layer disclosed in the present invention, compared to the performance of the prior art, are evident when reviewing data presented in the following charts.

Figure 2:
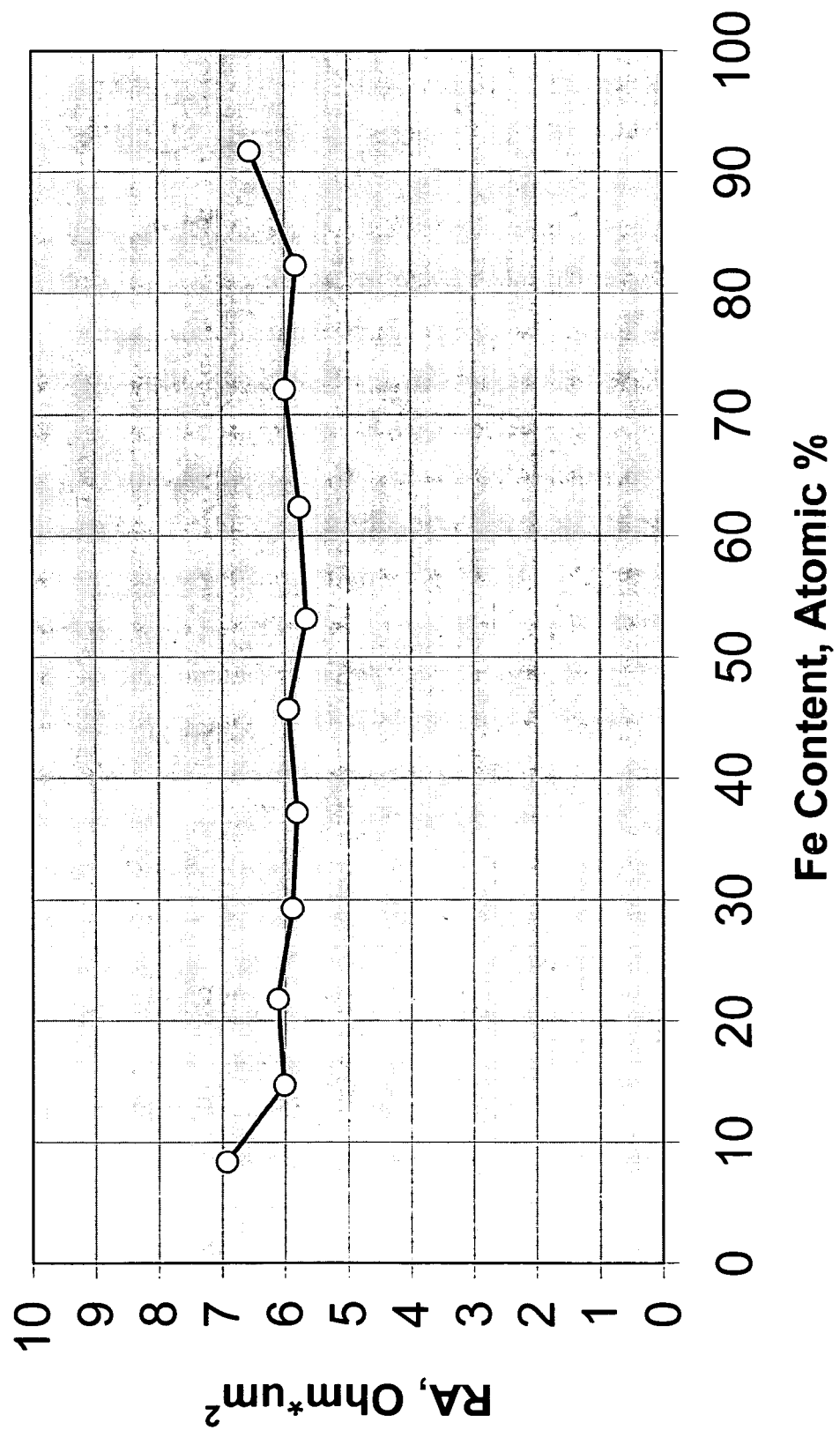
FIG. 2 is a chart of parameter RA as a function of free layer iron content, in accordance with an embodiment of the present invention.

FIG. 2 is a chart of parameter RA as a function of free layer iron content, in accordance with an embodiment of the present invention. For good performance, the lower RA, the better. For free layer iron concentrations less than about 15 atomic %, RA increases from about 6 to 7 ohm*μm². For free layer iron concentrations above about 83 atomic %, RA increases from about 5.8 to about 6.5 ohm*μm². Between about 15 and 83 atomic %, RA remains about constant, ranging from about 5.7 to 6.0 ohm*μm². These results indicate RA performance of the present invention to be on par with optimum results reported in the prior art, which suggest free layer iron concentrations less than about 20%.

Figure 3:
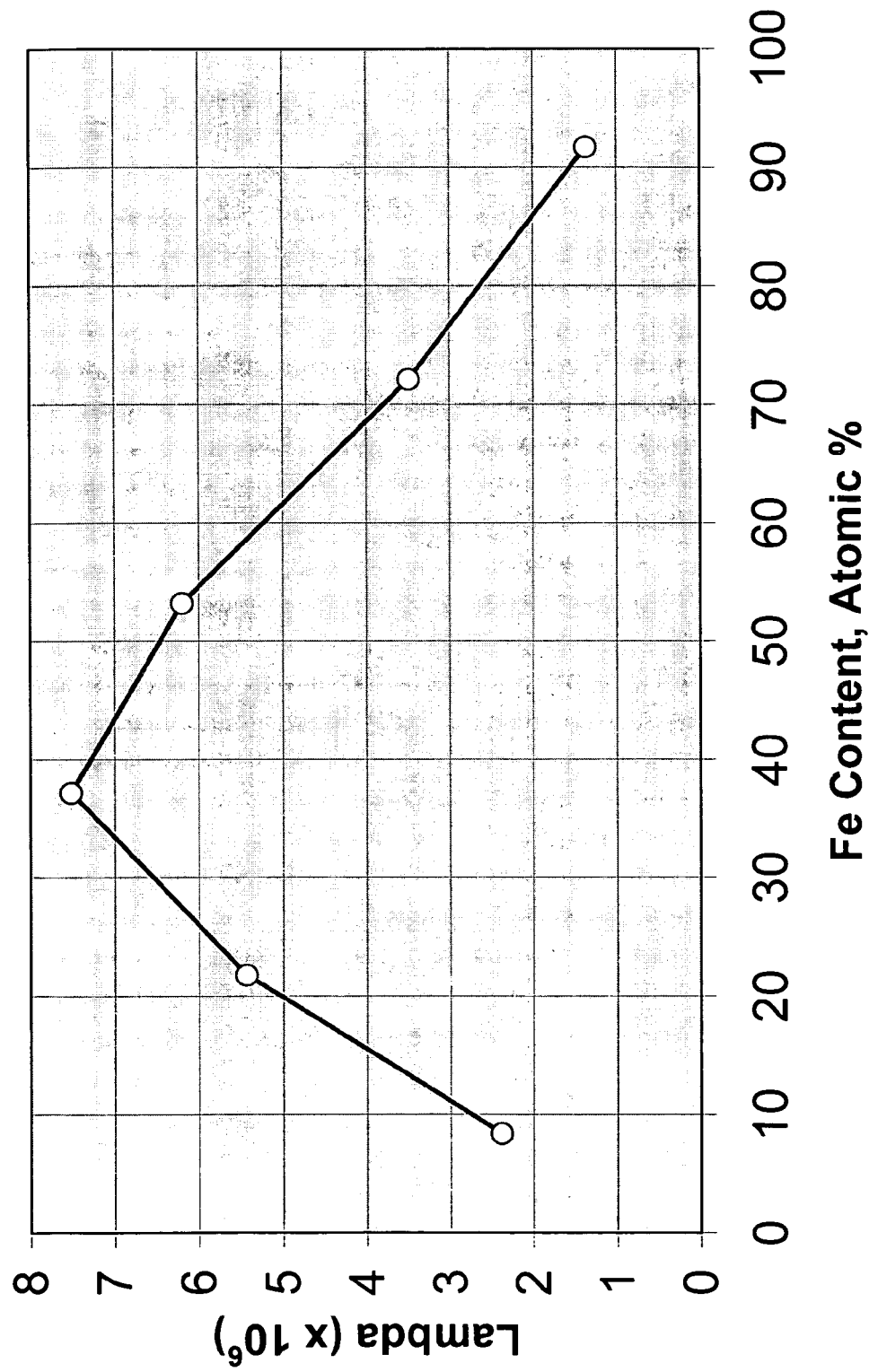
FIG. 3 is a chart of parameter Lambda (λ) as a function of free layer iron content, in accordance with an embodiment of the present invention.

FIG. 3 is a chart of parameter Lambda (λ, magnetostriction) as a function of free layer iron content, in accordance with an embodiment of the present invention. For good performance, the lower λ, the better. The chart in FIG. 3 shows two areas where λ displays a downward trend, one below free layer iron concentrations of about 37 atomic %, and one above free layer iron concentrations of 37 atomic %. At free layer iron concentrations between about 8 and 20 atomic %, λ ranges from about 5 to $2.2\times10^{-6}$. At free layer iron concentrations between about 76 and 92 atomic %, λ ranges from about 3.0 to $1.2\times10^{-6}$. These results indicate λ performance of the present invention to be an improvement, when compared with optimum results reported in the prior art.

Figure 4:
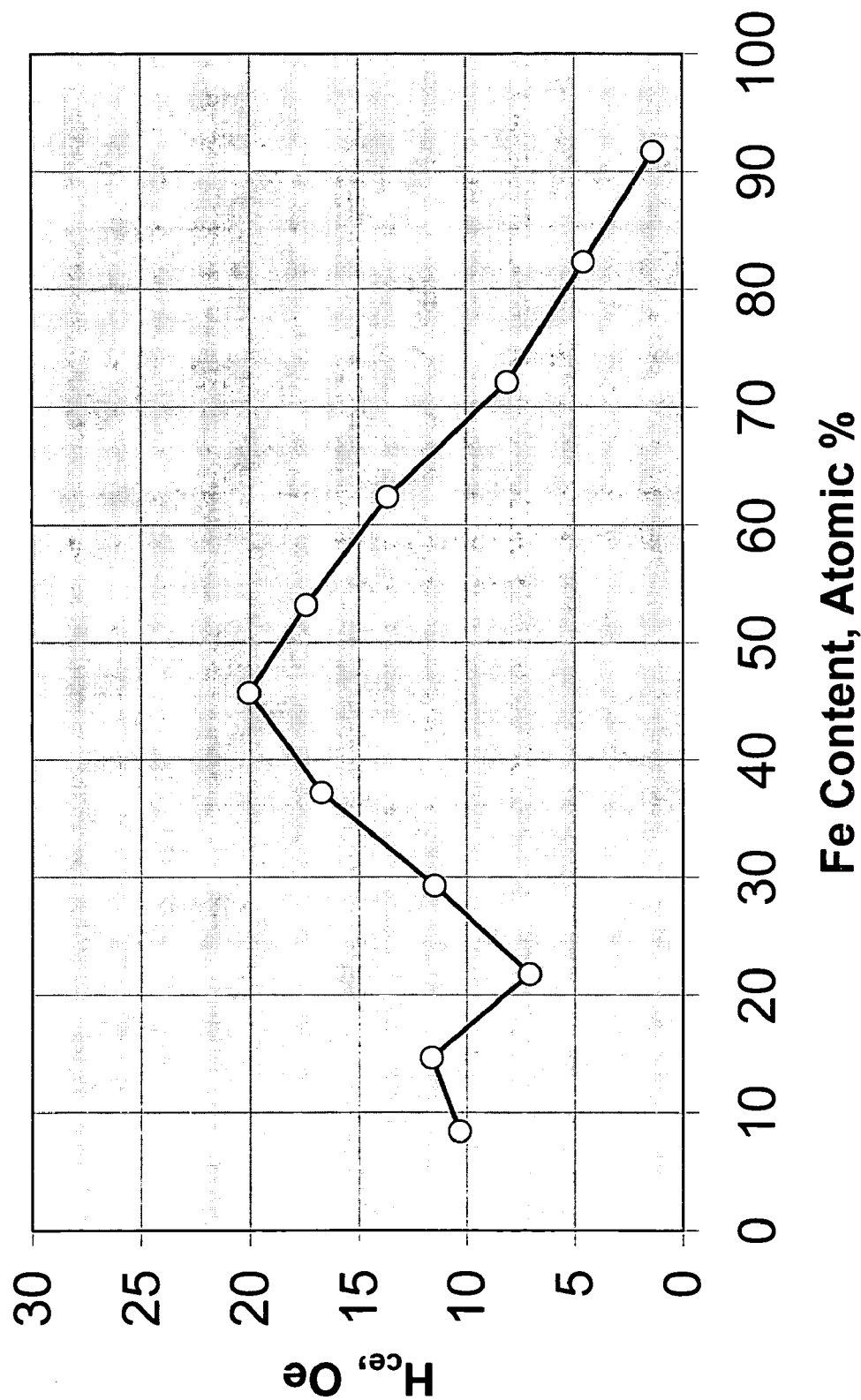
FIG. 4 is a chart of parameter $H_{ce}$ as a function of free layer iron content, in accordance with an embodiment of the present invention; and, FIG. 5 is a chart of parameter TMR ratio as a function of free layer iron content, in accordance with an embodiment of the present invention.

FIG. 4 is a chart of parameter $H_{ce}$ as a function of free layer iron content, in accordance with an embodiment of the present invention. For good performance, the lower coercivity ($H_{ce}$), the better. At free layer iron concentrations between about 8 and 20 atomic %, FIG. 4 indicates a coercivity ranging from about 7.5 to 12 Oe. At free layer iron concentrations between about 75 and 91 atomic %, $H_{ce}$ ranges from about 1 to 7.5 Oe. These results indicate coercivity performance of the present invention to be a significant improvement, when compared with optimum results reported in the prior art for low iron concentrations.

Figure 5:
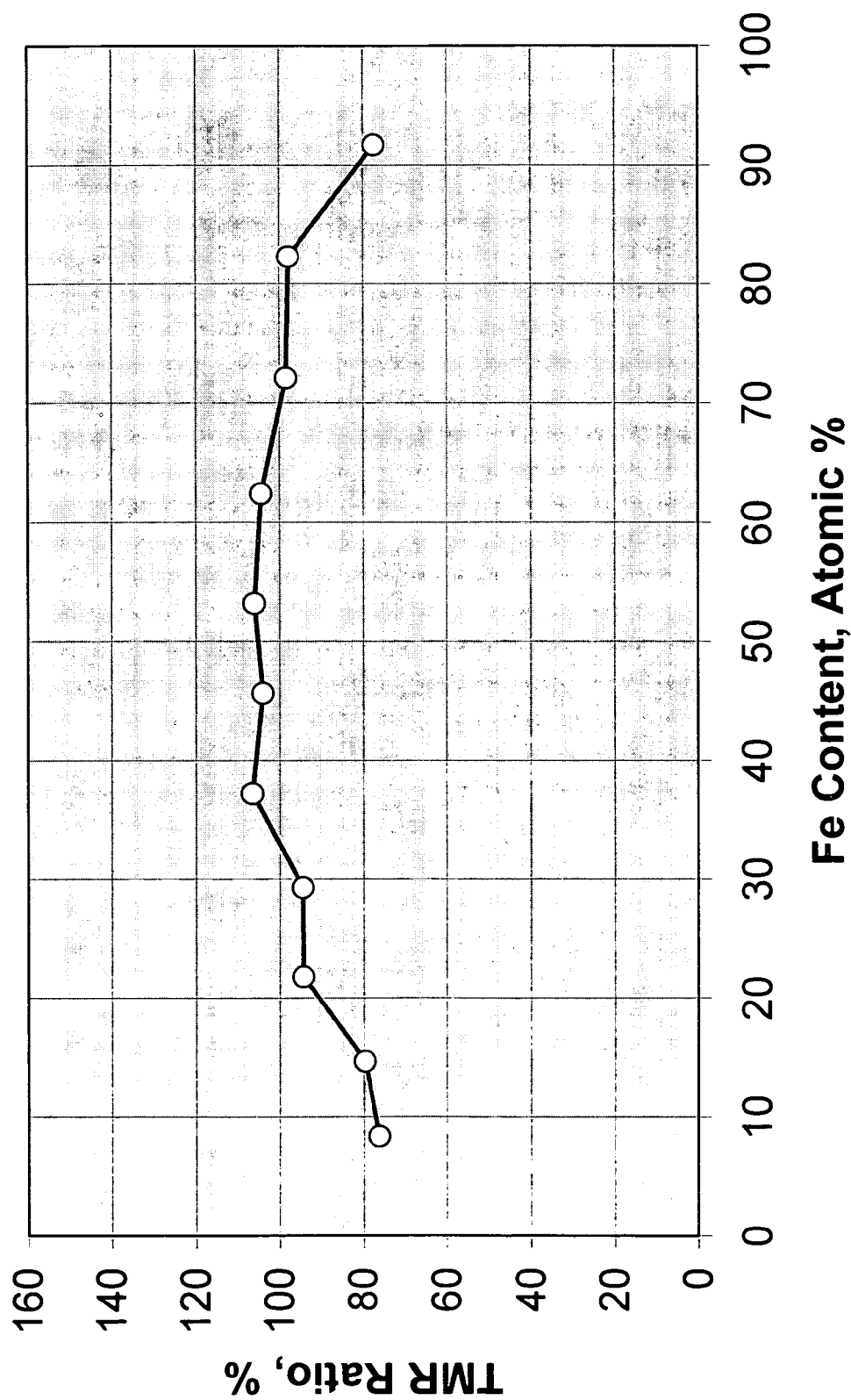

FIG. 5 is a chart of parameter TMR (tunneling magneto-resistance) ratio, expressed in units of %, as a function of free layer iron content, in accordance with an embodiment of the present invention. For good performance, the higher TMR ratio, the better. At free layer iron concentrations between about 8 and 20 atomic %, FIG. 5 indicates a TMR ratio value between about 75 and 90%. At free layer iron concentrations between about 75 and 91 atomic %, TMR ratio ranges from about 80 to 100%, with the highest TMR ratio value occurring at free layer iron concentrations between about 76 and 83 atomic %. These results indicate tunneling magneto-resistance performance of the present invention to be a significant improvement, when compared with optimum results reported in the prior art for low iron concentrations.

The present invention is not limited by the previous embodiments heretofore described. Rather, the scope of the present invention is to be defined by these descriptions taken together with the attached claims and their equivalents.

What is claimed is:

1. A magnetic sensor comprising:
    a pinned layer;
    a free layer, consisting essentially of an alloy of cobalt, iron, and boron, wherein an iron concentration in said alloy is greater than 70 atomic %, said free layer having a tunneling magneto-resistance ratio greater than 90%; and,
    a barrier layer residing between said pinned layer and said free layer.

2. The sensor as recited in claim 1, wherein said iron concentration is greater than 70 atomic % and less than 91.5 atomic %.

3. The sensor as recited in claim 1, wherein said iron concentration is greater than 76 atomic % and less than 83 atomic %.

4. The sensor as recited in claim 3, wherein a boron concentration is greater than 8.5 atomic % and less than 11 atomic %.

5. The sensor as recited in claim 1, wherein said barrier layer comprises oxides of magnesium.

6. The sensor as recited in claim 1, wherein said free layer has a resistance times area product less than 6.5 ohms-μm².

7. The sensor as recited in claim 1, wherein said free layer has a magnetostriction less than $3\times10^{-6}$.

8. The sensor as recited in claim 1, wherein said free layer has a coercivity less than 7.5 Oe.

9. A magnetic sensor comprising:
a pinning layer;
a first pinned layer;
a second pinned layer;
a spacer layer between said first and said second pinned layers;
a free layer, consisting essentially of an alloy of cobalt, iron, and boron, wherein an iron concentration in said alloy is greater than 70 atomic %, said free layer having a tunneling magneto-resistance ratio greater than 90%; and,
a barrier layer residing between said second pinned layer and said free layer, wherein said barrier layer comprises oxides of magnesium.

10. The sensor as recited in claim 9, wherein said pinning layer comprises alloys of iridium, manganese, and chromium.

11. The sensor as recited in claim 9, wherein said iron concentration is greater than 70 atomic % and less than 91.5 atomic %.

12. The sensor as recited in claim 9, wherein said iron concentration is greater than 76 atomic % and less than 83 atomic %.

13. The sensor as recited in claim 12, wherein a boron concentration is greater than 8.5 atomic % and less than 11 atomic %.

14. The sensor as recited in claim 9, wherein said first pinned layer comprises alloys of cobalt and iron.

15. The sensor as recited in claim 9, wherein said free layer has a resistance times area product less than 6.5 ohms-$\mu m^2$.

16. The sensor as recited in claim 9, wherein said second pinned layer comprises alloys of cobalt, iron, and boron.

17. The sensor as recited in claim 9, wherein said free layer has a coercivity less than 7.5 Oe.

18. The sensor as recited in claim 9, wherein said free layer has a magnetostriction less than $3 \times 10^{-6}$.

* * * * *